(12) United States Patent
Jung et al.

(10) Patent No.: US 9,753,593 B2
(45) Date of Patent: Sep. 5, 2017

(54) TOUCH PANEL AND METHOD OF MANUFACTURING THE SAME

(71) Applicant: Samsung Display Co., Ltd., Yongin, Gyeonggi-Do (KR)

(72) Inventors: Sung-Ki Jung, Asan-si (KR); Jung-Hyun Kim, Asan-si (KR)

(73) Assignee: Samsung Display Co., Ltd., Yongin-si, Gyeonggi-do (KR)

( * ) Notice: Subject to any disclaimer, the term of this patent is extended or adjusted under 35 U.S.C. 154(b) by 144 days.

(21) Appl. No.: 14/746,060

(22) Filed: Jun. 22, 2015

(65) Prior Publication Data

US 2016/0209949 A1 Jul. 21, 2016

(30) Foreign Application Priority Data

Jan. 16, 2015 (KR) ........................ 10-2015-0008166

(51) Int. Cl.
| | |
|---|---|
| *G06F 3/041* | (2006.01) |
| *G06F 3/044* | (2006.01) |
| *G06F 3/047* | (2006.01) |
| *G03F 7/00* | (2006.01) |
| *G03F 7/004* | (2006.01) |

(52) U.S. Cl.
CPC ............ *G06F 3/044* (2013.01); *G03F 7/0035* (2013.01); *G03F 7/0043* (2013.01); *G06F 3/047* (2013.01); *G06F 3/0412* (2013.01); *G06F 3/0416* (2013.01); *G06F 2203/04103* (2013.01)

(58) Field of Classification Search
USPC ........................................ 345/104, 173, 174
See application file for complete search history.

(56) References Cited

U.S. PATENT DOCUMENTS

| | | | | |
|---|---|---|---|---|
| 6,177,918 B1 * | 1/2001 | Colgan | ............. | G02F 1/134309 345/104 |
| 2007/0268243 A1 * | 11/2007 | Choo | .................. | G02F 1/13338 345/104 |

(Continued)

FOREIGN PATENT DOCUMENTS

| | | |
|---|---|---|
| KR | 10-2011-0025989 A | 3/2011 |
| KR | 10-2013-0015304 A | 2/2013 |

(Continued)

*Primary Examiner* — Thuy Pardo
(74) *Attorney, Agent, or Firm* — Knobbe Martens Olson & Bear LLP (57) ABSTRACT

A touch panel for a display device and a method of manufacturing the same are disclosed. In one aspect, the method includes forming a photosensitive insulating layer over a substrate and forming a first conductive layer over the photosensitive insulating layer. The method also includes exposing the first conductive layer via a first mask including a pattern corresponding to a wiring electrode, removing the first mask, developing the exposed first conductive layer and forming the photosensitive insulating layer over the first conductive layer. The method further includes forming a second conductive layer and a carrier film over the photosensitive insulating layer and first exposing the second conductive layer via a second mask; removing the carrier film. The method also includes developing the exposed second conductive layer, and forming and drying the wiring electrode over the second conductive layer and the photosensitive insulating layer.

19 Claims, 5 Drawing Sheets (56) References Cited

U.S. PATENT DOCUMENTS

| | | | | |
|---|---|---|---|---|
| 2008/0309635 A1* | 12/2008 | Matsuo | ............... | G06F 3/044 345/173 |
| 2011/0157086 A1* | 6/2011 | Ozeki | ............... | G06F 3/044 345/174 |
| 2011/0227867 A1* | 9/2011 | Ogawa | ............... | G06F 3/044 345/174 |
| 2015/0109231 A1* | 4/2015 | Shirai | ............... | G06F 3/044 345/173 |
| 2015/0109251 A1* | 4/2015 | Meng | ............... | G06F 3/044 345/174 |
| 2015/0169111 A1* | 6/2015 | Hashimoto | ............ | G06F 3/044 345/174 |
| 2015/0220202 A1* | 8/2015 | Choung | ............... | G06F 3/044 345/174 |

FOREIGN PATENT DOCUMENTS

| | | |
|---|---|---|
| KR | 10-2013-0026921 A | 3/2013 |
| KR | 10-2013-0035354 A | 4/2013 |

* cited by examiner

TOUCH PANEL AND METHOD OF MANUFACTURING THE SAME

INCORPORATION BY REFERENCE TO ANY PRIORITY APPLICATIONS

This application claims priority to and the benefit of Korean Patent Application No. 10-2015-0008166 filed in the Korean Intellectual Property Office on Jan. 16, 2015, the entire contents of which are incorporated herein by reference.

BACKGROUND

Field

The described technology generally relates to a touch panel and a method of manufacturing the same.

Description of the Related Technology

A flat panel display (FPD) such as organic light-emitting diode (OLED) displays, liquid crystal displays (LCDs), electrophoretic displays (EPDs), or the like, includes a display panel in which an electric field generating electrode and an electro-optical active layer are formed. The OLED display type includes an organic emission layer, the LCD type includes a liquid crystal layer, and the electrophoretic display type includes particles having a charge as the electro-optical active layer.

The electric field generating electrode can be connected to a switching device such as a thin film transistor, or the like, to receive a data signal, and the electro-optical active layer converts the data signal into an optical signal to display an image.

These display devices can include a touch sensing functionality that can interact with a user in addition to their functionality of displaying images. The touch sensing function indicates when the user touches a screen using a finger, a touch pen, or the like. The display device senses a change in pressure, electric charges, light, or the like, applied to the screen to detect touch information such as whether or not an object touches the screen, touch position, and the like. The display device then provides an image corresponding to the touch input.

SUMMARY OF CERTAIN INVENTIVE ASPECTS

One inventive aspect relates to a touch panel and a method of manufacturing the same.

Another aspect is a new touch panel structure that includes a conductive layer of the touch panel formed in two layers made of a photosensitive silver nano wire (AgNW) to connect a wiring electrode to the conductive layer through a via hole or directly connect the wiring electrode to the conductive layer by a contact therebetween and forming the wiring electrode by one-time printing so as to simplify a process.

Another aspect is a method of manufacturing a touch panel, including: a photosensitive insulating layer forming step of forming a photosensitive insulating layer on a substrate; a first conductive layer forming step of forming a first conductive layer on the photosensitive insulating layer; a first exposing step of exposing the first conductive layer by using a first mask formed with a pattern corresponding to a sensing electrode and a wiring; a first conductive layer developing step of removing the first mask and then developing the exposed first conductive layer; a second conductive layer forming step of forming the photosensitive insulating layer on the first conductive layer and forming a second conductive layer and a carrier film on the photosensitive insulating layer; a second exposing step of exposing the second conductive layer using a second mask; a third exposing step of removing the carrier film, applying a photoresist, and exposing the second conductive layer; a second conductive layer developing step of developing the exposed second conductive layer; and a wiring electrode forming step of forming and drying a wiring electrode on the second conductive layer and a photosensitive insulating layer.

The first conductive layer and the second conductive layer can be made of photosensitive silver nano wire (AgNW).

In the third exposing step, the photoresist can be applied to a predetermined portion for forming a via hole.

In the wiring electrode forming step, the first conductive layer can be connected to the wiring electrode through the via hole.

In the wiring electrode forming step, the wiring electrode can be connected to the second conductive layer.

In the third exposing step, the photoresist can be applied and exposed to expose a portion of the first conductive layer and the photosensitive insulating layer to the outside.

In the wiring electrode forming step, the wiring electrode can be formed to contact the first conductive layer and the photosensitive insulating layer which are exposed to the outside.

Another aspect is a touch panel, including: a substrate; a photosensitive insulating layer formed on the substrate; a first conductive layer formed in the photosensitive insulating layer; a second conductive layer formed on the photosensitive insulating layer on the first conductive layer; and a wiring electrode formed on the second conductive layer.

The first conductive layer and the second conductive layer can be made of photosensitive silver nano wire (AgNW).

The wiring electrode can be connected to the first conductive layer through a via hole which is formed in a portion of the photosensitive insulating layer.

A portion of the first conductive layer and the photosensitive insulating layer can be exposed to the outside and the wiring electrode can contact the first conductive layer and the photosensitive insulating layer which are exposed.

The wiring electrode can be made of silver (Ag) or copper (Cu).

Another aspect is a method of manufacturing a touch panel for a display device, comprising: forming a photosensitive insulating layer over a substrate; forming a first conductive layer over the photosensitive insulating layer; exposing the first conductive layer via a first mask including a pattern corresponding to a wiring electrode; removing the first mask; developing the exposed first conductive layer; forming the photosensitive insulating layer over the first conductive layer; forming a second conductive layer and a carrier film over the photosensitive insulating layer; first exposing the second conductive layer via a second mask; removing the carrier film; applying a photoresist onto the second conductive layer; second exposing the second conductive layer; developing the exposed second conductive layer; and forming and drying the wiring electrode over the second conductive layer and the photosensitive insulating layer.

In the above method, each of the first and second conductive layers is formed of photosensitive silver nano wire (AgNW).

In the above method, the photoresist is applied to a predetermined portion of the second conductive layer so as to form a via hole.

In the above method, the forming and drying comprises electrically connecting the first conductive layer to the wiring electrode through the via hole.

In the above method, the forming and drying comprises electrically connecting the wiring electrode to the second conductive layer.

The above method further comprises exposing portions of the first conductive layer and the photosensitive insulating layer to the environment.

The above method further comprises: exposing portions of the first conductive layer and the photosensitive insulating layer are exposed to the environment; and forming the wiring electrode to contact the exposed portions of the first conductive layer and the photosensitive insulating layer.

In the above method, the first conductive layer includes at least one first layer which is surrounded by the photosensitive insulating layer and at least one second layer which is at least partially exposed to the environment.

Another aspect is a touch panel for a display device, comprising: a substrate; a photosensitive insulating layer formed over the substrate; a first conductive layer at least partially surrounded by the photosensitive insulating layer; a second conductive layer formed over the photosensitive insulating layer; and a wiring electrode formed over the second conductive layer and the photosensitive insulating layer.

In the above touch panel, each of the first and second conductive layers is formed of photosensitive silver nano wire (AgNW).

In the above touch panel, a via hole is formed in a portion of the photo sensitive insulating layer, wherein the wiring electrode is electrically connected to the first conductive layer through the via hole.

In the above touch panel, portions of the first conductive layer and the photosensitive insulating layer are exposed to the environment, wherein the wiring electrode contacts the exposed portions of the first conductive layer and the photosensitive insulating layer.

In the above touch panel, the wiring electrode is formed of silver (Ag) or copper (Cu).

In the above touch panel, the first conductive layer includes at least one first layer which is surrounded by the photosensitive insulating layer and at least one second layer which is at least partially exposed to the environment.

Another aspect is a touch panel for a display device, comprising: a substrate; a photosensitive insulating layer formed over the substrate; a first conductive layer including at least one first layer and at least one second layer; a second conductive layer formed over the photosensitive insulating layer; and a wiring electrode partially covering at least one of the first and second conductive layers and the photosensitive insulating layer, wherein the at least one first layer is surrounded by the photosensitive insulating layer, and wherein the at least one second layer contacts the wiring electrode.

In the above touch panel, each of the first and second conductive layers is formed of photosensitive silver nano wire (AgNW).

In the above touch panel, a via hole is formed in a portion of the photo sensitive insulating layer, wherein the wiring electrode is electrically connected to the first conductive layer through the via hole.

In the above touch panel, portions of the first conductive layer and the photosensitive insulating layer are exposed to the environment via openings of the wiring electrode.

In the above touch panel, the second layer is at least partially exposed to the environment by an opening defined by the wiring electrode and the photosensitive insulating layer.

In the above touch panel, the at least one first layer and the at least one second layer have substantially the same width.

According to at least one of the disclosed embodiments, it is possible to provide the new touch panel structure in which the conductive layer of the touch panel is formed in the two layers made of the photosensitive silver nano wire (AgNW) to connect the wiring electrode to the conductive layer through the via hole or directly connect the wiring electrode to the conductive layer by the contact therebetween and form the wiring electrode by the one-time printing so as to simplify the process.

DETAILED DESCRIPTION OF CERTAIN INVENTIVE EMBODIMENTS

Typically, in a bridge type touch panel, the manufacturing process includes forming an X-Y pattern on a conductive surface and forming a bridge using an insulating layer and metal. Dry film lamination, exposure, development, etching, peeling processes are required, and therefore, the process is complicated. Further, film annealing, insulating layer processes, and the like require a high temperature process of about 150° C. Therefore, a problem can arise in that a base film needs to be selected in consideration of heat-resistance.

Hereinafter, the described technology will be described more fully hereinafter with reference to the accompanying drawings, in which exemplary embodiments are shown. As those skilled in the art would realize, the described embodiments can be modified in various different ways, all without departing from the spirit or scope of the described technology.

It is to be noted that the accompanying drawings is schematically illustrated and is not illustrated to a scale. A relative dimension and ratio of components are illustrated being exaggerated or reduced in the drawings for clarity and convenience in the drawings and any dimension is only an example and therefore is not limited thereto. Further, the same structures, elements, or parts which are illustrated in at least two drawings are denoted by the same reference numerals, which are used to indicate similar features. The mention that any portion is present "over" or "on" another portion means that any portion can be directly formed on another portion or a third portion can be interposed between one portion and another portion.

An exemplary embodiment will be described in detail. As the result, numerous variations of exemplary embodiments are expected. Therefore, the exemplary embodiments are not limited to a specific form of the illustrated region and, for example, also include a form changed by manufacturing. In this disclosure, the term "substantially" includes the meanings of completely, almost completely or to any significant degree under some applications and in accordance with those skilled in the art. Moreover, "formed on" can also mean "formed over." The term "connected" can include an electrical connection.

Figure 1:
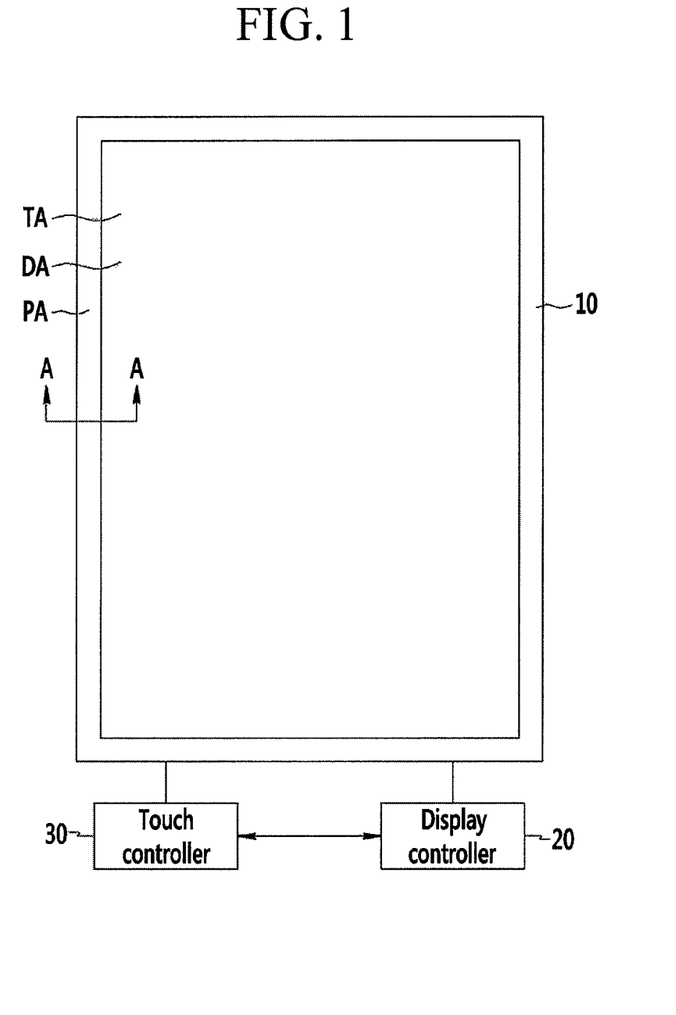
FIG. 1 is a layout view schematically illustrating a display device including a touch panel according to an exemplary embodiment.

FIG. 1 is a layout view schematically illustrating a display device including a touch panel according to an exemplary embodiment. Referring to FIG. 1, a display device according to an exemplary embodiment includes a display panel 10, a display controller 20 connected to the display panel 10, and a touch controller 30. Depending on embodiments, certain elements may be removed from or additional elements may be added to the display device illustrated in FIG. 1. Furthermore, two or more elements may be combined into a single element, or a single element may be realized as multiple elements.

The display panel 10 includes a touch sensor that senses a contact of external objects such as a hand or a pen. The touch sensor can be formed on an outer surface of the display panel 10 (on-cell type) and can also be formed inside the display panel 10 (in-cell type). Further, the touch sensor is formed in a separate panel to be attached on display panels such as an OLED display or a liquid crystal display (add-on type). Hereinafter, the display device according to the exemplary embodiment will be described in detail with reference to the on-cell type touch sensor in which the touch sensor is formed on an upper surface of the display panel of the OLED display. However, a type of the touch sensor and a kind of the display device are not limited thereto.

The display panel 10 displays an image and senses a touch. The display panel 10 includes a display area DA in which a real image is displayed, a touch area TA which can sense a touch, and a peripheral area PA around the display area DA, when viewed from a plane structure.

When an object directly contacts the display panel 10 (contact touch) or hovers in a state in which the object is close to or approaches the display panel 10 (non-contact touch), the touch area TA is an area which can sense the contact or the hovering as the touch. The touch area TA can overlap the display area DA and can approximately coincide with the display area DA.

Figure 2:
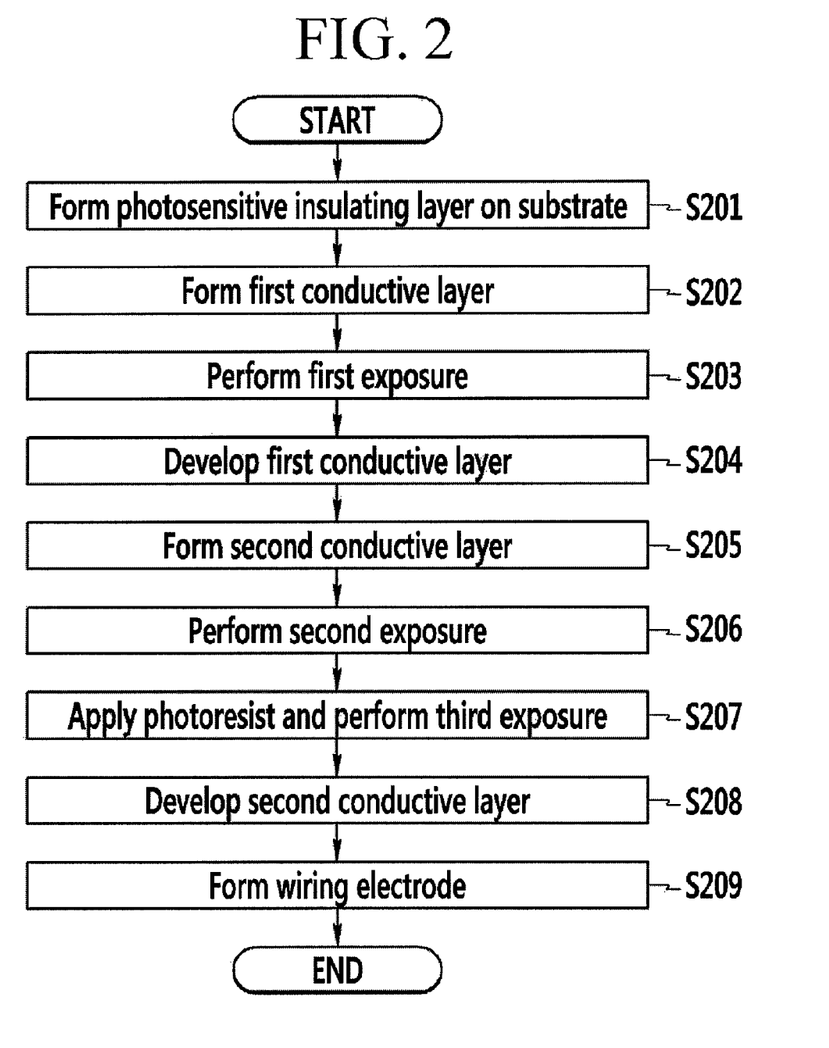
FIG. 2 is a flowchart illustrating a method of manufacturing a touch panel according to an exemplary embodiment.

FIG. 2 is a flowchart illustrating a method of manufacturing a touch panel according to an exemplary embodiment. FIGS. 3A to 3H are process cross-sectional views illustrating a portion taken along the line A-A of FIG. 1 for describing the method of manufacturing a touch panel according to the exemplary embodiment. Depending on embodiments, additional states may be added, others removed, or the order of the states changed in the procedure of FIG. 2.

Figure 3A:
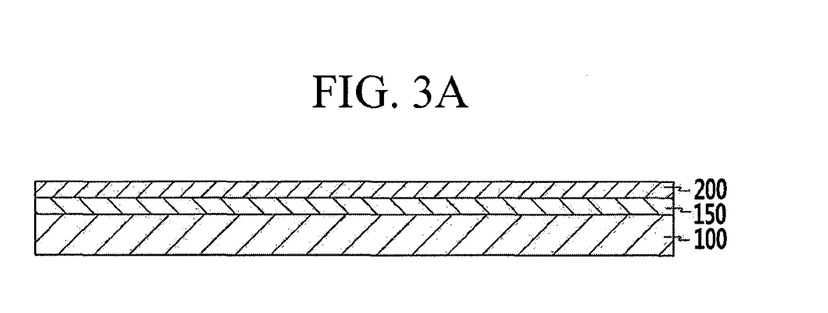
FIGS. 3A to 3H are process cross-sectional views illustrating a portion taken along the line A-A of FIG. 1 for describing the method of manufacturing a touch panel according to the exemplary embodiment.
Figure 3B:
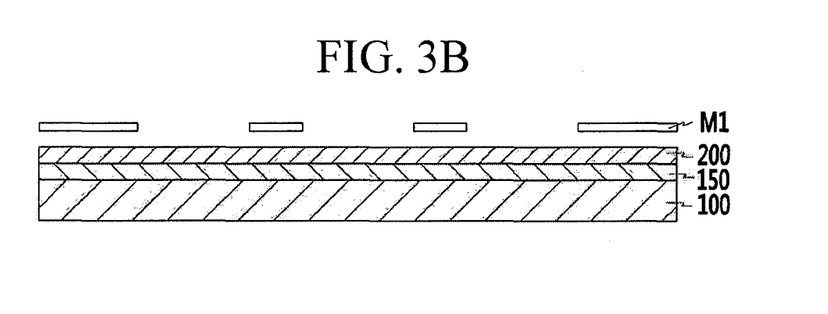
Figure 3C:
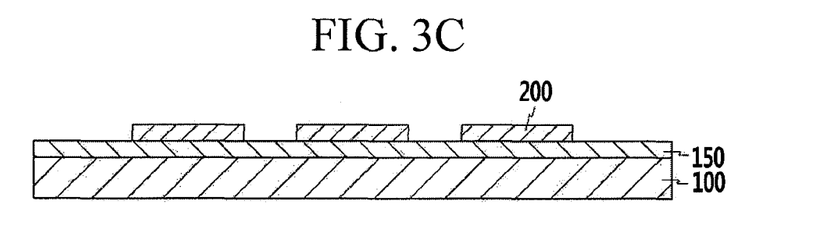
Figure 3D:
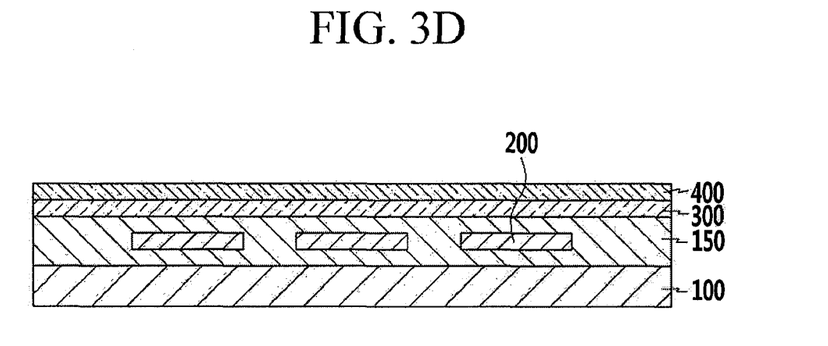
Figure 3E:
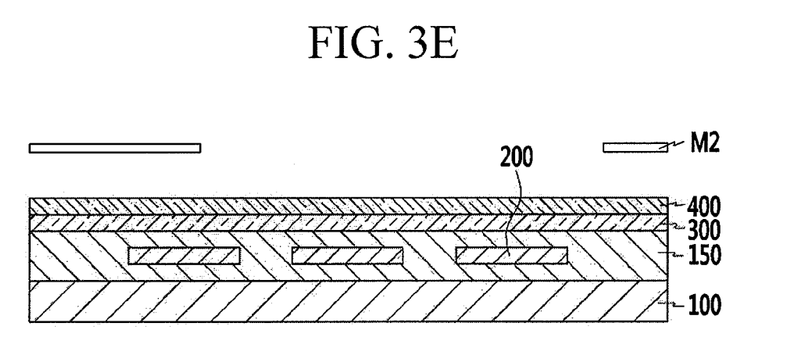
Figure 3F:
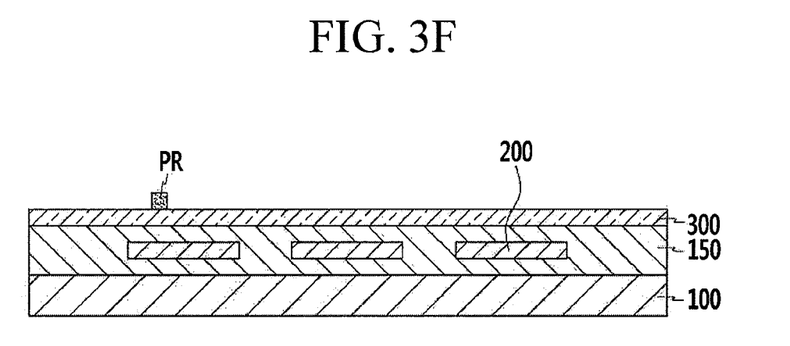
Figure 3G:
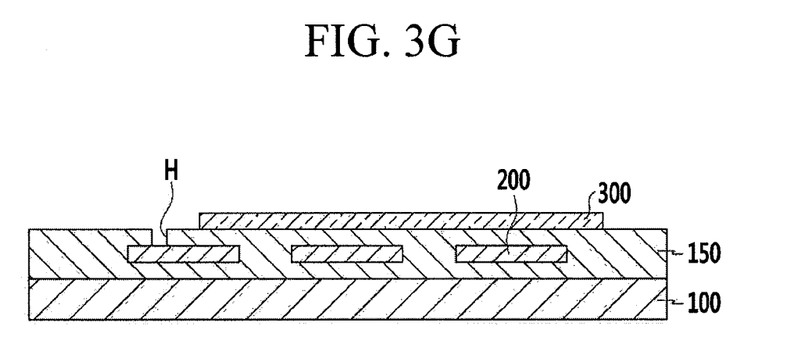
Figure 3H:
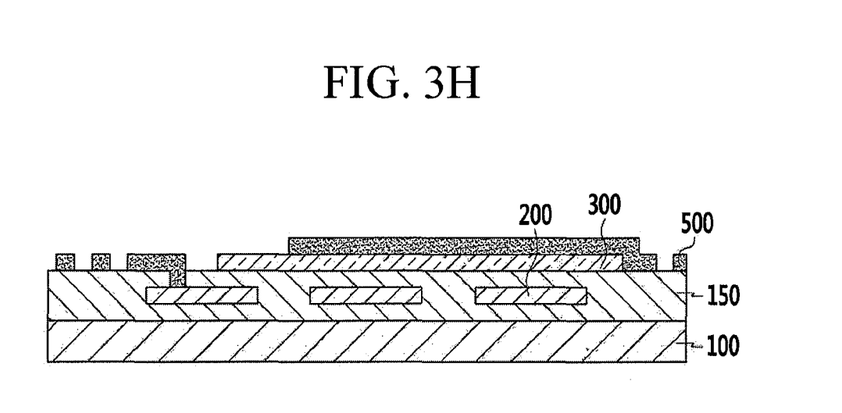

Referring to FIGS. 2 to 3H, first, a photosensitive insulating layer is formed on the substrate 100 (S201, FIG. 3A). The substrate 100 includes a substrate or a flexible substrate formed of transparent insulating materials such as glass or plastic. The photosensitive insulating layer 150 is formed on substantially the whole surface of the substrate 100 and serves to insulate the substrate 100 from a first conductive layer 200.

Next, the first conductive layer 200 is formed on the photosensitive insulating layer 150 (S202, FIG. 3A). The first conductive layer 200 is formed of a transparent material and can be formed of photosensitive silver nano wire (AgNW). Further, the first conductive layer 200 can also be formed of indium tin oxide (ITO), grapheme, and conductive polymer.

Next, the first conductive layer 200 is exposed by a first mask M1 formed with a pattern (S203, FIG. 3B)

The first conductive layer 200 can be formed of the photosensitive silver nano wire and can be exposed to ultraviolet rays (UV), etc. The first mask M1 is formed of a transparent material such as glass and the light blocking pattern can be formed of chromium (Cr), and the like.

Next, after the first mask M1 is removed, the exposed first conductive layer 200 is developed (S204, FIG. 3C). The first conductive layer formed of the photosensitive silver nano wire is used as a negative type in which the exposed portion can remain after the development and therefore the exposed first conductive layer 200 portion remains on the photosensitive insulating layer 150 after the development The first conductive layer 200 can be used as a positive type in which the exposed portion can be removed by the development.

Next, the photosensitive insulating layer 150 is formed on the first conductive layer 200, and the second conductive layer 300 and the carrier film 400 are formed on the photosensitive insulating layer 150 (S205, FIG. 3D). The photosensitive insulating layer 150 is formed, and thus the first conductive layer 200 is positioned inside the photosensitive insulating layer. The second conductive layer 300 can be formed of the photosensitive silver nano wire (AgNW). Further, the second conductive layer 300 can also be formed of indium tin oxide (ITO), grapheme, and conductive polymer which are the transparent material.

Next, the second conductive layer 300 is exposed using the second mask M2 (S206, FIG. 3E). Similar to the first mask M1, the second mask M2 is formed of a transparent material such as glass and the light blocking pattern can be formed of chromium (Cr), and the like.

Next, the carrier film 400 is removed, the photoresist PR is applied, and the second conductive layer 300 is exposed (S207, FIG. 3F). In this case, the photoresist PR is applied on the second conductive layer 300, corresponding to a portion where the via hole H is formed on the photosensitive insulating layer 150. The photoresist PR can be a liquid-phase photosensitive emulsion or a photosensitive film in a film form.

Next, the exposed second conductive layer 300 is developed (S208, FIG. 3G). The second conductive layer 300 is also formed of the photosensitive silver nano wire and is used as the negative type in which the exposed portion can remain by the development. Therefore, the exposed second conductive layer 300 portion remains after the development. The second conductive layer 300 can also be used as the positive type in which the exposed portion can be removed by the development.

Next, the wiring electrode 500 is formed on the second conductive layer 300 and the photosensitive insulating layer 150, and the wiring electrode 500 is dried (S209, FIG. 3H). The wiring electrode 500 can be formed of molybdenum (M0), silver (Ag), titanium (Ti), aluminum (Al), and copper (Cu) which have a resistance value lower than that of the first and second conductive layers 200 and 300. The wiring electrode 500 can be formed to be connected to the first conductive layer 200 through the via hole H. Further, the wiring electrode 500 can be formed to directly contact the second conductive layer 300.

Figure 4A:
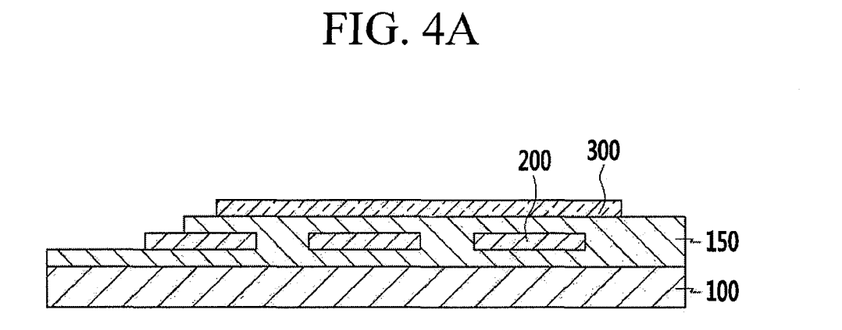
FIGS. 4A to 4B are process cross-sectional views illustrating a process of forming a wiring electrode according to another exemplary embodiment.
Figure 4B:
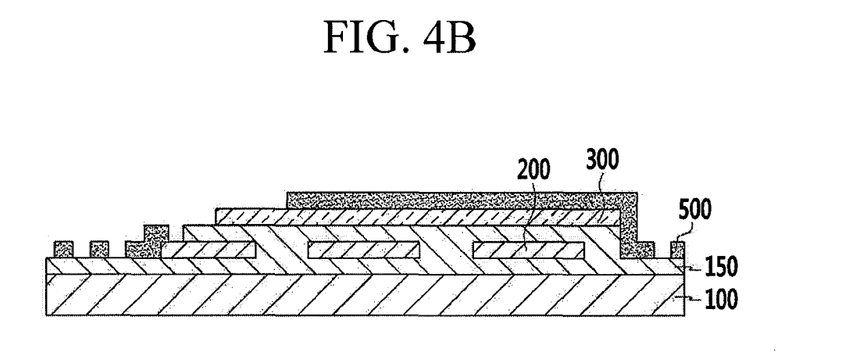

FIGS. 4A and 4B are process cross-sectional views illustrating a process of forming a wiring electrode according to another exemplary embodiment.

Referring to FIGS. 4A and 4B, as described in the exemplary embodiment as described above, in step (S206) of removing the carrier film 400 and exposing the second conductive layer 300, instead of applying and exposing the photoresist PR for forming the via hole H, the photoresist PR can be applied to expose a portion of the first conductive layer 200 and the photosensitive insulating layer 150 to the environment. The portion can be exposed and developed (FIG. 4A). Next, the wiring electrode 500 can be formed to contact the first conductive layer 200 and the photosensitive insulating layer 150 which are exposed to the outside or environment (FIG. 4B).

Meanwhile, referring to FIG. 3H, the touch panel according to the exemplary embodiment includes the substrate 100, the photosensitive insulating layer 150 formed on the substrate 100, the first conductive layer 200 formed in the photosensitive insulating layer 150, the second conductive layer 300 formed on the photosensitive insulating layer 150 which is formed on the first conductive layer 200, and the wiring electrode 500 formed on the second conductive layer 300.

A substrate or a flexible substrate formed of transparent insulating materials such as glass or plastic is used as the substrate 100. The photosensitive insulating layer 150 is formed on substantially the whole surface of the substrate 100 and serves to insulate the substrate 100 from the first conductive layer 200.

Further, the first conductive layer 200 and the second conductive layer 300 can also be formed of the photosensitive silver nano wire (AgNW) and can be formed of indium tin oxide, grapheme, and conductive polymer which are a transparent material.

Further, the wiring electrode 500 can be connected to the first conductive layer 200 through the via hole H which is formed in the photosensitive insulating layer 150. Further, the wiring electrode 500 can be formed of molybdenum (Mo), silver (Ag), titanium (Ti), aluminum (Al), and copper (Cu) which have a resistance value lower than that of the first conductive layer 200 and the second conductive layer 300.

Meanwhile, as illustrated in FIG. 4B, a portion of the first conductive layer 200 and the photosensitive insulating layer 150 are exposed to the outside. The wiring electrode 500 can be formed to contact the first conductive layer 200 and the photosensitive insulating layer 150 which are exposed.

According to at least one of the disclosed embodiments of the touch panel and the method of manufacturing a touch panel, it is possible to provide the new touch panel structure. In the new touch panel structure, the conductive layer of the touch panel is formed in the two layers formed of the photosensitive silver nano wire (AgNW) to connect the wiring electrode to the conductive layer through the via hole or directly connect the wiring electrode to the conductive layer by the contact therebetween and form the wiring electrode by printing only one time so as to simplify the process.

While this disclosure has been described in connection with what is presently considered to be practical exemplary embodiments, it is to be understood that the inventive technology is not limited to the disclosed embodiments, but, on the contrary, is intended to cover various modifications and equivalent arrangements included within the spirit and scope of the appended claims.

What is claimed is:

1. A method of manufacturing a touch panel for a display device, comprising:
   forming a photosensitive insulating layer over a substrate;
   forming a first conductive layer over the photosensitive insulating layer;
   exposing the first conductive layer via a first mask including a pattern corresponding to a wiring electrode;
   removing the first mask;
   developing the exposed first conductive layer;
   forming the photosensitive insulating layer over the first conductive layer;
   forming a second conductive layer and a carrier film over the photosensitive insulating layer;
   first exposing the second conductive layer via a second mask;
   removing the carrier film;
   applying a photoresist onto the second conductive layer;
   second exposing the second conductive layer;
   developing the exposed second conductive layer; and
   forming and drying the wiring electrode over the second conductive layer and the photosensitive insulating layer, wherein each of the first and second conductive layers is formed of photosensitive silver nano wire (AgNW), and wherein the wiring electrode is electrically connected to the first conductive layer.

2. The method of claim 1, wherein, the photoresist is applied to a predetermined portion of the second conductive layer so as to form a via hole.

3. The method of claim 2, wherein, the forming and drying comprises electrically connecting the first conductive layer to the wiring electrode through the via hole.

4. The method of claim 1, wherein, the forming and drying comprises electrically connecting the wiring electrode to the second conductive layer.

5. The method of claim 1, further comprising exposing portions of the first conductive layer and the photosensitive insulating layer to the environment.

6. The method of claim 1, further comprising:
   exposing portions of the first conductive layer and the photosensitive insulating layer to the environment; and
   forming the wiring electrode to contact the exposed portions of the first conductive layer and the photosensitive insulating layer.

7. The method of claim 1, wherein the first conductive layer includes at least one first layer which is surrounded by the photosensitive insulating layer and at least one second layer which is at least partially exposed to the environment.

8. A touch panel for a display device, comprising:
   a substrate;
   a photosensitive insulating layer formed over the substrate;
   a first conductive layer at least partially surrounded by the photosensitive insulating layer;
   a second conductive layer formed over the photosensitive insulating layer; and
   a wiring electrode formed over the second conductive layer and the photosensitive insulating layer, wherein each of the first and second conductive layers is formed of photosensitive silver nano wire (AgNW), and wherein the wiring electrode is electrically connected to the first conductive layer.

9. The touch panel of claim 8, wherein a via hole is formed in a portion of the photosensitive insulating layer, and wherein the wiring electrode is electrically connected to the first conductive layer through the via hole.

10. The touch panel of claim 8, wherein portions of the first conductive layer and the photosensitive insulating layer are exposed to the environment, and wherein the wiring electrode contacts the exposed portions of the first conductive layer and the photosensitive insulating layer.

11. The touch panel of claim 8, wherein the wiring electrode is formed of silver (Ag) or copper (Cu).

12. The touch panel of claim 8, wherein the first conductive layer includes at least one first layer which is surrounded by the photosensitive insulating layer and at least one second layer which is at least partially exposed to the environment.

13. The touch panel of claim 8, wherein the photosensitive insulating layer is configured to electrically insulate the first and second conductive layers.

14. The touch panel of claim 8, wherein the first conductive layer comprises a plurality of sub-conductive layers, and wherein a cross-section of at least one sub-conductive layer is completely surrounded by the photosensitive insulating layer.

15. A touch panel for a display device, comprising:
   a substrate;
   a photosensitive insulating layer formed over the substrate;
   a first conductive layer including at least one first layer and at least one second layer;
   a second conductive layer formed over the photosensitive insulating layer; and
   a wiring electrode partially covering at least one of the first and second conductive layers and the photosensitive insulating layer, wherein the at least one first layer is surrounded by the photosensitive insulating layer, wherein the at least one second layer contacts the wiring electrode, wherein each of the first and second conductive layers is formed of photosensitive silver nano wire (AgNW), and wherein the wiring electrode is electrically connected to the first conductive layer.

16. The touch panel of claim 15, wherein a via hole is formed in a portion of the photosensitive insulating layer, and wherein the wiring electrode is electrically connected to the first conductive layer through the via hole.

17. The touch panel of claim 15, wherein portions of the first conductive layer and the photosensitive insulating layer are exposed to the environment via openings of the wiring electrode.

18. The touch panel of claim 15, wherein the second layer is at least partially exposed to the environment by an opening defined by the wiring electrode and the photosensitive insulating layer.

19. The touch panel of claim 15, wherein the at least one first layer and the at least one second layer have substantially the same width.

* * * * *